United States Patent [19]
Thero et al.

[11] Patent Number: 5,612,232
[45] Date of Patent: Mar. 18, 1997

[54] METHOD OF FABRICATING SEMICONDUCTOR DEVICES AND THE DEVICES

[75] Inventors: Christine Thero, Scottsdale; Mohit Bhatnagar; Charles E. Weitzel, both of Mesa, all of Ariz.

[73] Assignee: Motorola, Schaumburg, Ill.

[21] Appl. No.: 625,605

[22] Filed: Mar. 29, 1996

[51] Int. Cl.[6] .................. H01L 21/265; H01L 21/20; H01L 21/44

[52] U.S. Cl. .............. 437/39; 437/24; 437/100; 437/176; 437/904

[58] Field of Search ............... 437/24, 39, 100, 437/175, 176, 203, 904; 148/DIG. 148; 257/76, 77

[56] References Cited

U.S. PATENT DOCUMENTS 3,982,262  9/1976  Karatsjuba et al. ............ 437/100
5,323,040  6/1994  Baliga .......................... 257/77
5,506,421  4/1996  Palmour ........................ 257/77

Primary Examiner—Mary Wilczewski
Assistant Examiner—Brian K. Dutton
Attorney, Agent, or Firm—Eugene A. Parsons

[57] ABSTRACT

A method of fabricating a semiconductor device including forming a Schottky contact on the surface of a substrate by patterning a layer of nickel to define a contact and annealing the nickel below approximately 600° C. A trench is etched around the Schottky contact utilizing the Schottky contact as an etch mask and inert ions are implanted in the trench to form a damage region. The trench is passivated with a dielectric layer. An ohmic contact can be formed on the reverse side of the substrate prior to formation of the Schottky contact.

19 Claims, 2 Drawing Sheets

METHOD OF FABRICATING SEMICONDUCTOR DEVICES AND THE DEVICES

FIELD OF THE INVENTION

The present invention pertains to methods of fabricating semiconductor devices and the devices and more specifically to methods of fabricating semiconductor devices including Schottky diodes, or contacts, and the Schottky diodes, or contacts.

BACKGROUND OF THE INVENTION

It is well known in the art that guard rings and the like can be diffused into the substrates of silicon semiconductor devices (and especially silicon power devices) for purposes of terminating or separating devices on a common substrate. However, devices formed on silicon carbide (SIC) substrates cannot be terminated using diffused guard rings because of the very small diffusion coefficients of conventional dopants in SiC. Use of field plates on SiC substrates is also limited since high electric fields in the dielectric and the subsequent breakdown of the dielectric is likely to occur before avalanche breakdown of the SiC.

In particular, the power performance of present SiC diodes is limited by high reverse leakage current. The leakage current in SiC Schottky diodes and p-n diodes, for example, is two orders of magnitude higher than the reverse leakage current in silicon diodes or rectifiers. In many instances the prior art uses thermally grown oxide as a field termination, which is an extremely slow process and provides unreliable results.

In the fabrication of semiconductor devices, it is known that damaging the substrate in an area surrounding a gate contact with implants of electrically inactive ions affects the electrical field along the surface of the substrate and, hence, the breakdown voltage of the device. See for example, U.S. Pat. No. 5,399,883, entitled "High Voltage Silicon Carbide MESFETS and Methods of Fabricating Same" issued Mar. 11, 1995. In all of these prior art devices, the damaged area extends at least from the gate electrode to the drain electrode, and in some devices the damage region also extends to the source electrode.

The ion implantation damage is the most successful electric field termination structure to date. Additionally, it has been found that annealing the implant at a temperature below 400° C. helps to reduce the reverse leakage current. However, when the implant is annealed at temperatures in excess of 400° C. the damage starts to be removed from the crystalline structure, thus decreasing the effectiveness of the termination.

Also, all of these prior art devices, in actual practice, have relatively large reverse leakage current and a soft-breakdown. Accordingly, it would be highly advantageous to provide a method of fabricating silicon carbide rectifiers and other semiconductor devices using Schottky contacts with an improved reverse breakdown characteristics.

It is a purpose of the present invention to provide a new and improved method of fabricating semiconductor devices.

It is another purpose of the present invention to provide a new and improved method of fabricating semiconductor devices including a Schottky diode or contact.

It is still another purpose of the present invention to provide a new and improved method of fabricating semiconductor devices including a Schottky diode or contact with improved reverse breakdown characteristics.

It is yet another purpose of the present invention to provide a new and improved method of fabricating semiconductor devices including a Schottky diode or contact on silicon carbide substrates with improved reverse breakdown characteristics.

It is a further purpose of the present invention to provide new and improved semiconductor devices including Schottky diodes or contacts.

It is still a further purpose of the present invention to provide new and improved semiconductor devices including Schottky diodes or contacts with improved reverse breakdown characteristics.

It is yet a further purpose of the present invention to provide new and improved semiconductor devices including Schottky diodes or contacts on silicon carbide substrates with improved reverse breakdown characteristics.

SUMMARY OF THE INVENTION

The above problems and others are at least partially solved and the above purposes and others are realized in a method of fabricating a semiconductor device including providing a semiconductor substrate structure having first and second surfaces and forming a Schottky contact on the first surface of the substrate structure. A trench is etched in the semiconductor structure around the Schottky contact utilizing the Schottky contact as an etch mask and inert ions are implanted in the trench to form a damage region around the Schottky contact.

The above problems and others are at least partially solved and the above purposes and others are further realized in a semiconductor device including a Schottky diode including a silicon carbide substrate structure having first and second surfaces with a Schottky contact positioned on the first surface of the substrate structure. A trench is defined in the semiconductor structure around the Schottky contact and inert ions is implanted in the trench to form a damage region. A dielectric layer is deposited on the semiconductor device so as to cover and passivate the trench.

BRIEF DESCRIPTION OF THE DRAWINGS

Referring to the drawings.

DESCRIPTION OF THE PREFERRED EMBODIMENTS

Figure 1:
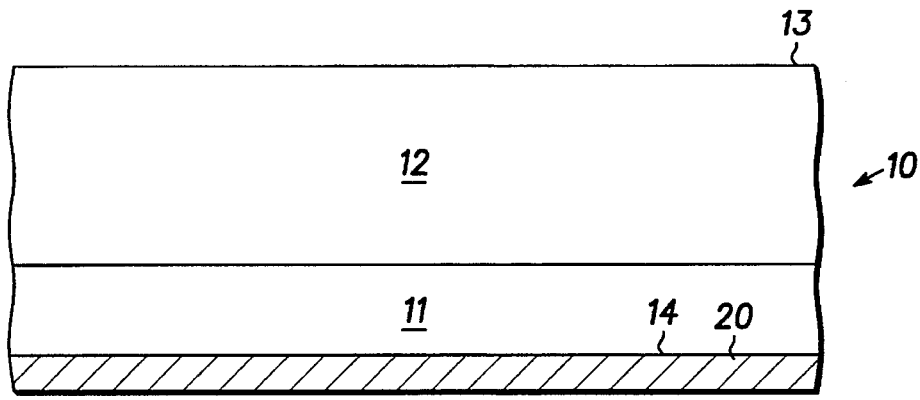
FIGS. 1 through 5 are simplified cross-sectional views illustrating various steps in a fabrication process of a Schottky diode in accordance with the present invention.

Turning now to the drawings, FIGS. 1 through 5 are simplified cross-sectional views illustrating various steps in a fabrication process of a Schottky diode or contact in accordance with the present invention. Referring specifically to FIG. 1, a simplified cross-sectional view of a substrate structure 10 is illustrated including a substrate 11 having a lightly doped layer 12 formed thereon by some convenient method, such as epitaxial growth. While substrate 11 and layer 12 might be a variety of different materials, in this specific example substrate 11 is formed of a relatively heavily doped ($n^+$) silicon carbide (SIC) while layer 12 is lightly doped (n) silicon carbide. For purposes of this disclosure the term "substrate structure" will be utilized to indicate a substrate and other layers (e.g. channel layers, barrier layers, matching layers, etc.) formed thereon. Substrate structure 10 has an upper surface 13 and a lower surface 14.

In this specific example, an ohmic contact 20 is formed on surface 14 of substrate structure 10 by depositing a layer of metal and annealing the metal at a temperature above 900° C. For example, a layer of nickel (Ni) is deposited on surface 14 and annealed at a temperature of 950° C. to form an ohmic contact with substrate structure 10. Ohmic contact 20 is formed prior to the following steps because the high anneal temperature could adversely effect the following steps and structure.

Figure 2:
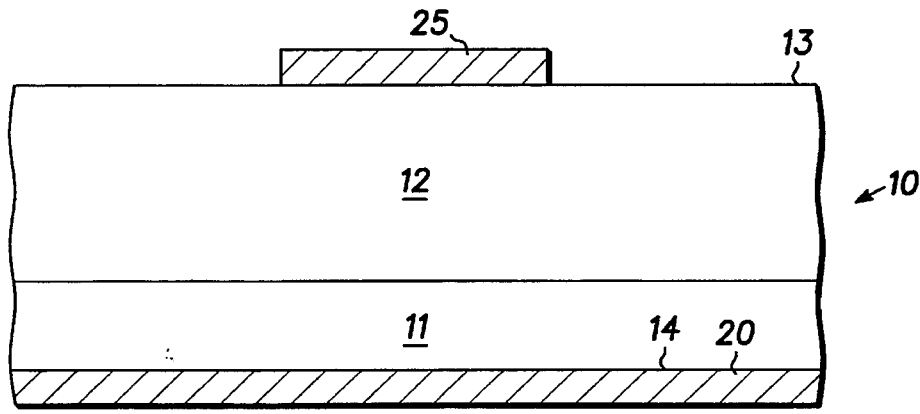

Referring to FIG. 2, a layer of Schottky metal is deposited on surface 13 of substrate structure 10 and patterned to define a contact 25. The formation of the layer and the patterning can be accomplished using any of the well known semiconductor procedures, such as lift-off, etching, etc. In a preferred embodiment, contact 25 includes nickel and is annealed at a temperature in excess of 400° C. (as high as 600° C.). It has been found, for example, that nickel Schottky contacts annealed at a temperature of 500° C. have substantially decreased reverse leakage current and an improved ideality factor compared to devices fabricated with titanium contacts. A major problem that arises in prior art devices and other structures is that the Schottky contact is formed after the damage implantation step, and annealing the implantation at temperatures above 400° C. can "heal" the crystal damage caused by the implantation to the point that it is ineffective as an electrical field termination.

Figure 3:
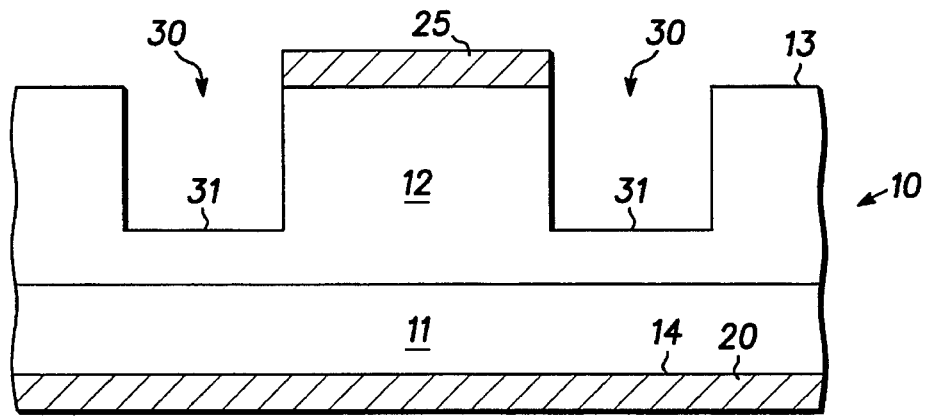

Referring specifically to FIG. 3, a trench 30 having a bottom 31 is etched in substrate structure 10, using Schottky contact 25 as an etch mask. Here it should be understood that while trench 30 will generally be a continuous trench surrounding Schottky contact 25, in some specific applications separate trenches, elongated trenches, or trenches with other shapes might be utilized. In this specific example, trench 30 is formed by using a reactive ion etch procedure which is continued until trench 30 (bottom 31) is at a depth greater than 1 μm and generally in a range of approximately 1 μm to 5 μm.

Figure 4:
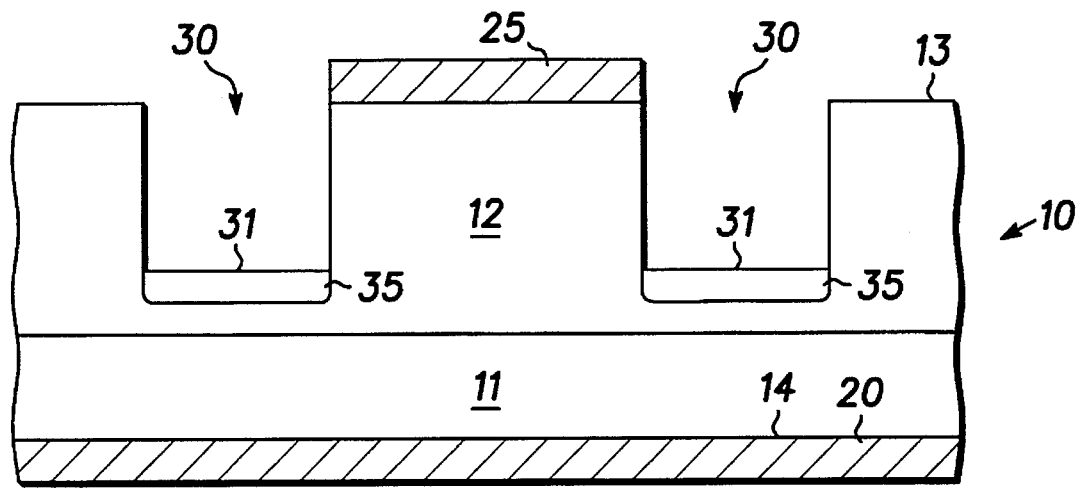

Turning now to FIG. 4, implant damage region 35 is formed in bottom 31 of trench 30 by implanting material in substrate structure 10 through trench 30 to form high resistivity implant damage region 35. In general, the material utilized for implanting is inert ions or other electrically inactive material such as argon, krypton, etc. In a specific example, a 1e15 dose of ions of argon ($Ar^+$) are implanted with an energy of 30 KeV. While implant damage region 35 can be used without annealing in some applications, in this preferred embodiment region 35 is annealed at a temperature below approximately 400° C., and preferably approximately 350° C., to increase its effectiveness as an electrical field termination and further reduce reverse leakage current of the device.

Figure 5:
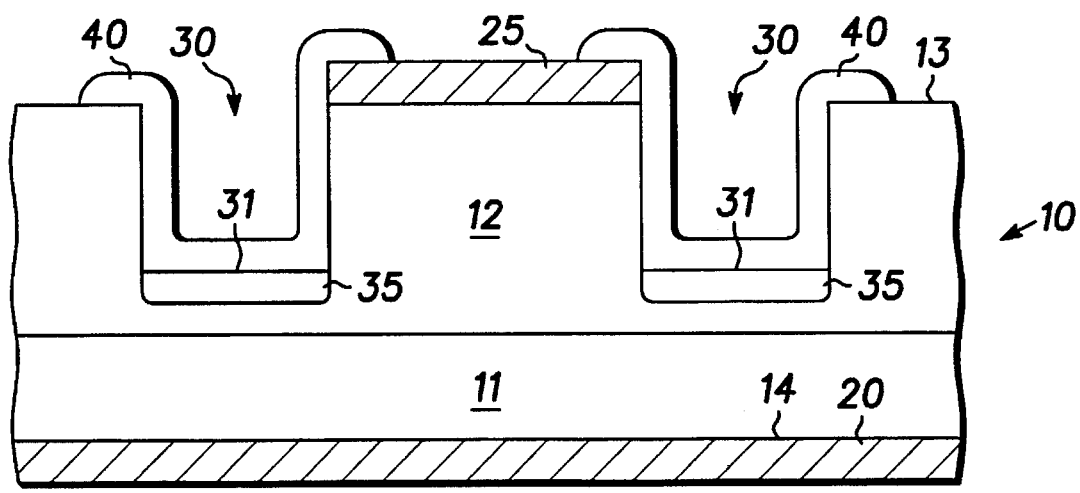

Turning now to FIG. 5, a dielectric layer 40 is deposited over the surfaces of trench 30, a portion of Schottky contact 25, and at least a portion of surface 13 of substrate structure 10. Generally in actual practice, dielectric layer 40 is deposited over the entire structure and windows are opened by etching or the like to allow access to Schottky contact 25. While dielectric layer 40 is illustrated as a thin layer only on the sides and bottom 31 of trench 30, it will be understood that in some applications trench 30 could be filled with dielectric material. Therefore, dielectric layer 40 not only forms a dielectric field plate but also serves as a passivation layer for the device.

Thus, improved fabrication processes are disclosed which incorporate improved electrical field termination including implant damage areas and improved field plates. The improved fabrication processes are especially useful for the manufacturing of Schottky diodes or contacts and semiconductor devices incorporating Schottky diodes or contacts. Also, the present novel process does not require additional process steps compared to current processes. The Schottky contact forms a self-aligned mask for the etching of the trench, or mesa. Further, this novel process reduces leakage current by at least an order of magnitude without adversely affecting the forward voltage drop.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a semiconductor device comprising the steps of:

providing a semiconductor substrate structure having first and second surfaces;

forming a Schottky contact on the first surface of the substrate structure;

etching a trench in the semiconductor structure around the Schottky contact utilizing the Schottky contact as an etch mask; and implanting material to form a damage region in the trench.

2. The method of fabricating a semiconductor device as claimed in claim 1 wherein the step of providing the semiconductor substrate structure includes providing the semiconductor substrate structure with a silicon carbide substrate.

3. The method of fabricating a semiconductor device as claimed in claim 1 wherein the step of forming the Schottky contact includes depositing a layer of metal and patterning the layer of metal to define said Schottky contact.

4. The method of fabricating a semiconductor device as claimed in claim 3 wherein the step of depositing the layer of metal includes depositing a layer including nickel.

5. The method of fabricating a semiconductor device as claimed in claim 4 wherein the step of depositing the layer including nickel further includes annealing the layer including nickel at a temperature up to 600° C.

6. The method of fabricating a semiconductor device as claimed in claim 5 wherein the step of annealing the layer including nickel at a temperature up to 600° C. includes performing the annealing step in an inert gas.

7. A method of fabricating a semiconductor device as claimed in claim 1 wherein the step of etching the trench includes etching the trench to a depth of approximately 1 to 5 μm deep.

8. The method of fabricating a semiconductor device as claimed in claim 7 wherein the step of etching the trench to a depth of approximately 1 to 5 μm deep includes using a reactive ion etch.

9. The method of fabricating a semiconductor device as claimed in claim 8 wherein the 1 to 5 μm deep trench defines a bottom surface in the trench and the step of implanting material includes implanting the material in the bottom surface of the trench.

10. The method of fabricating a semiconductor device as claimed in claim 1 further including, subsequent to the step of implanting a damage region, passivating the trench with a dielectric layer.

11. The method of fabricating a semiconductor device as claimed in claim 1 wherein the step of passivating the trench includes depositing a dielectric layer on surfaces of the trench.

12. The method of fabricating a semiconductor device as claimed in claim 11 wherein the step of depositing the dielectric layer on surfaces of the trench includes depositing a layer of silicon nitride.

13. The method of fabricating a semiconductor device as claimed in claim 1 including in addition a step of forming an electrical ohmic contact on the second surface of the substrate structure prior to the step of forming a Schottky contact on the first surface.

14. The method of fabricating a semiconductor device as claimed in claim 13 wherein the step of forming the electrical ohmic contact on the second surface includes depositing a layer of Ni on the second surface.

15. The method of fabricating a semiconductor device as claimed in claim 14 wherein the step of forming the electrical contact on the second surface includes annealing the electrical contact at a temperature greater than 900° C.

16. The method of fabricating a semiconductor device as claimed in claim 1 wherein the step of implanting material includes implanting an inert material.

17. The method of fabricating a semiconductor device as claimed in claim 16 wherein the step of implanting the inert material includes implanting one of argon or krypton.

18. The method of fabricating a semiconductor device as claimed in claim 1 wherein the step of implanting the material further includes annealing the material at a temperature less than approximately 400° C. for approximately 5 minutes.

19. A method of fabricating a semiconductor device including a Schottky contact comprising the steps of:

providing a silicon carbide semiconductor substrate structure having first and second surfaces;

forming a Schottky contact on the first surface of the substrate structure by forming a layer of nickel on the surface, patterning the nickel to define an electrical contact and annealing the nickel below approximately 600° C. to form a Schottky contact on the first surface;

etching a trench in the semiconductor structure around the Schottky contact utilizing the Schottky contact as an etch mask;

implanting material in the trench to form a damage region in the trench; and passivating the trench with a dielectric layer.

* * * * *